United States Patent
Oka

(10) Patent No.: US 10,860,004 B2
(45) Date of Patent: Dec. 8, 2020

(54) MANAGEMENT SYSTEM AND NON-TRANSITORY COMPUTER-READABLE RECORDING MEDIUM

(71) Applicant: OMRON Corporation, Kyoto (JP)

(72) Inventor: Minoru Oka, Moriyama (JP)

(73) Assignee: OMRON Corporation, Kyoto (JP)

( * ) Notice: Subject to any disclaimer, the term of this patent is extended or adjusted under 35 U.S.C. 154(b) by 304 days.

(21) Appl. No.: 15/751,464

(22) PCT Filed: Nov. 10, 2016

(86) PCT No.: PCT/JP2016/083388
§ 371 (c)(1),
(2) Date: Feb. 8, 2018

(87) PCT Pub. No.: WO2017/094472
PCT Pub. Date: Jun. 8, 2017

(65) Prior Publication Data
US 2018/0259944 A1   Sep. 13, 2018

(30) Foreign Application Priority Data

Dec. 1, 2015   (JP) ................................. 2015-235013

(51) Int. Cl.
*G05B 19/418*   (2006.01)
*G05B 23/02*   (2006.01)
(Continued)

(52) U.S. Cl.
CPC ..... *G05B 19/41835* (2013.01); *G05B 19/418* (2013.01); *G05B 19/4185* (2013.01);
(Continued)

(58) Field of Classification Search
CPC ........ G05B 19/41835; G05B 19/41875; G05B 19/418; G05B 19/4185; G05B 23/02;
(Continued)

(56) References Cited

U.S. PATENT DOCUMENTS 6,522,939 B1 * 2/2003 Strauch ............ G05B 19/41875
700/116
9,323,234 B2 * 4/2016 Zhou .................... G05B 13/048
(Continued)

FOREIGN PATENT DOCUMENTS

EP       1967996         9/2008
JP   09301327 A   * 11/1997
(Continued)

OTHER PUBLICATIONS

Herminigildo Biado, "Cost of quality A measurement tool for continuous improvement", Thesis for the Degree Master of Science in Quality Assurance, California State University at Dominguez Hills, Fall 1999 (Year: 1999).*
(Continued)

*Primary Examiner* — Thomas C Lee
*Assistant Examiner* — Michael Tang
(74) *Attorney, Agent, or Firm* — JCIPRNET

(57) ABSTRACT

Provided is a management system for performing quality management on manufacturing equipment. A management system that includes: an acquisition component that acquires state information for manufacturing equipment that is subject to management; a determination component that, on the basis of the acquired state information, determines whether an event has occurred; a display component that displays both an image that schematically or realistically represents a manufacturing line included in the manufacturing equipment and, separated into the four perspectives Machine, Man, Material, and Method, indexes that indicate the likelihood that there is a factor that caused an event; and an output component that, when a specific event has occurred, outputs, in response to a user selection, analysis results for each of one or more factors belonging to each of the four
(Continued)

perspectives, the analysis results indicating a likelihood of having caused the specific event that occurred.

17 Claims, 11 Drawing Sheets

(51) Int. Cl.
  *H05K 13/00* (2006.01)
  *G06Q 10/06* (2012.01)
  *H05K 3/34* (2006.01)

(52) U.S. Cl.
  CPC ....... *G05B 19/41875* (2013.01); *G05B 23/02* (2013.01); *G06Q 10/06395* (2013.01); *H05K 3/341* (2013.01); *H05K 13/00* (2013.01); *G05B 2219/32187* (2013.01); *G05B 2219/32214* (2013.01); *G05B 2219/32221* (2013.01); *Y02P 90/02* (2015.11)

(58) Field of Classification Search
  CPC ........... G05B 2219/32187; G05B 2219/32221; G05B 2219/32214; G06Q 10/06395; H05K 3/341; H05K 13/00; Y02P 90/18; Y02P 90/22
  See application file for complete search history.

(56) References Cited

U.S. PATENT DOCUMENTS

| | | | |
|---|---|---|---|
| 2006/0070014 A1* | 3/2006 | Liu | G05B 19/41875 438/14 |
| 2008/0219544 A1* | 9/2008 | Tasaki | G06Q 10/06 382/141 |
| 2014/0075003 A1* | 3/2014 | Tanaka | H04L 41/50 709/223 |
| 2017/0052518 A1* | 2/2017 | Wang | G05B 19/409 |

FOREIGN PATENT DOCUMENTS

| | | | |
|---|---|---|---|
| JP | 2000-326184 | | 11/2000 |
| JP | 2000326184 A | * | 11/2000 |
| JP | 2015-153914 | | 8/2015 |
| WO | 2014030256 | | 2/2014 |

OTHER PUBLICATIONS

"Search Report of Europe Counterpart Application", dated Jun. 27, 2019, p. 1-p. 9.
"International Search Report (Form PCT/ISA/210)" of PCT/JP2016/083388, dated Jan. 10, 2017, with English translation thereof, pp. 1-2.
"Written Opinion of the International Searching Authority (Form PCT/ISA/237)" of PCT/JP2016/083388, dated Jan. 10, 2017, with English translation thereof, pp. 1-8.

* cited by examiner

FIG. 2 (FIELD INFORMATION)

| FACTOR Yn / EVENT Xm | FACTOR 1(Y1) | FACTOR 2(Y2) | FACTOR 3(Y3) | ... |
|---|---|---|---|---|
| EVENT 1(X1) | P(X1:Y1) | P(X1:Y2) | P(X1:Y3) | ... |
| EVENT 2(X2) | P(X2:Y1) | P(X2:Y2) | P(X2:Y3) | ... |
| EVENT 3(X3) | P(X3:Y1) | P(X3:Y2) | P(X3:Y3) | ... |
| ⋮ | ⋮ | ⋮ | ⋮ | ⋱ |

MANAGEMENT SYSTEM AND NON-TRANSITORY COMPUTER-READABLE RECORDING MEDIUM

CROSS-REFERENCE TO RELATED APPLICATION

This application is a 371 application of the International PCT application serial no. PCT/JP2016/083388, filed on Nov. 10, 2016, which claims the priority benefits of Japan Patent Application No. 2015-235013, filed on Jan. 12, 2015. The entirety of the above-mentioned patent application is hereby incorporated by reference herein and made a part of this specification.

TECHNICAL FIELD

The present invention relates to a management system and a non-transitory computer-readable recording medium for performing quality management of manufacturing equipment.

BACKGROUND ART

With the progress of recent information and communication technology (ICT), further improvement of quality management for manufacturing equipment is required. As a configuration for performing such quality management, Japanese Patent Application Laid-Open (JP-A) No. 2015-153914 (Patent Literature 1) discloses a quality management device for managing a surface mounting line which performs a solder printing process of performing solder printing on a printed circuit board using a solder printing device, a mounting process of arranging electronic parts on the printed circuit board using a mounter, and a reflow process of solder-bonding the electronic parts using a reflow furnace. This quality management device provides a technology for reducing a likelihood of generation of defects by managing the surface mounting line in response to the operating state of the surface mounting line.

CITATION LIST

Patent Literature

[Patent Literature 1]
Japanese Patent Application Laid-Open (JP-A) No. 2015-153914

SUMMARY OF INVENTION

Technical Problem

The quality management device disclosed in the aforementioned Patent Literature 1 is suitable for quality management of the surface mounting line but cannot be used for other manufacturing lines and the like as it is.

According to the progress of information and communication technology, a configuration in which even information from each and every sensor of manufacturing equipment can be collected has been realized. With respect to quality management of manufacturing equipment, further improvement of quality management according to the progress of information and communication technology is required.

Solution to Problem

According to an embodiment of the present invention, a management system for performing quality management of manufacturing equipment is provided. The management system includes an acquisition component which acquires state information of manufacturing equipment that is a management target, a determination component which determines whether an event has occurred on the basis of the acquired state information, a display component which displays indexes indicating likelihoods of presence of factors of four perspectives including Machine, Man, Material and Method having caused occurrence of events along with images that schematically or realistically represent manufacturing lines included in the manufacturing equipment, and an output component which, when a specific event has occurred, outputs analysis results indicating a likelihood of occurrence of the specific event being caused by each of one or more factors belonging to each of the four perspectives in response to user selection.

Preferably, the output component collectively displays other factors related to a factor estimated to have caused occurrence of the specific event.

Preferably, the specific event includes suspension of a manufacturing line, and occurrence of an abnormality in an operation of a manufacturing line.

Preferably, the display component displays the specific event that has occurred in association with a portion of a target device constituting a manufacturing line.

Preferably, the display component displays combinations of images that represent respective manufacturing lines and indexes for the respective four perspectives with respect to each of a plurality of manufacturing lines side by side.

According to another embodiment of the present invention, a management program for performing quality management of manufacturing equipment is provided. The management program causes a computer to function as an acquisition component which acquires state information of manufacturing equipment that is a management target, a determination component which determines whether an event has occurred on the basis of the acquired state information, a display component which displays indexes indicating likelihoods of presence of factors of four perspectives including Machine, Man, Material and Method having caused occurrence of events along with images that schematically or realistically represent manufacturing lines included in the manufacturing equipment, and an output component which, when a specific event has occurred, outputs analysis results indicating a likelihood of occurrence of the specific event being caused by each of one or more factors belonging to each of the four perspectives in response to user selection.

Advantageous Effects of Invention

According to an embodiment of the present invention, further improved quality management of manufacturing equipment according to the progress of information and communication technology can be realized.

DESCRIPTION OF PREFERRED EMBODIMENTS

Figure 1:
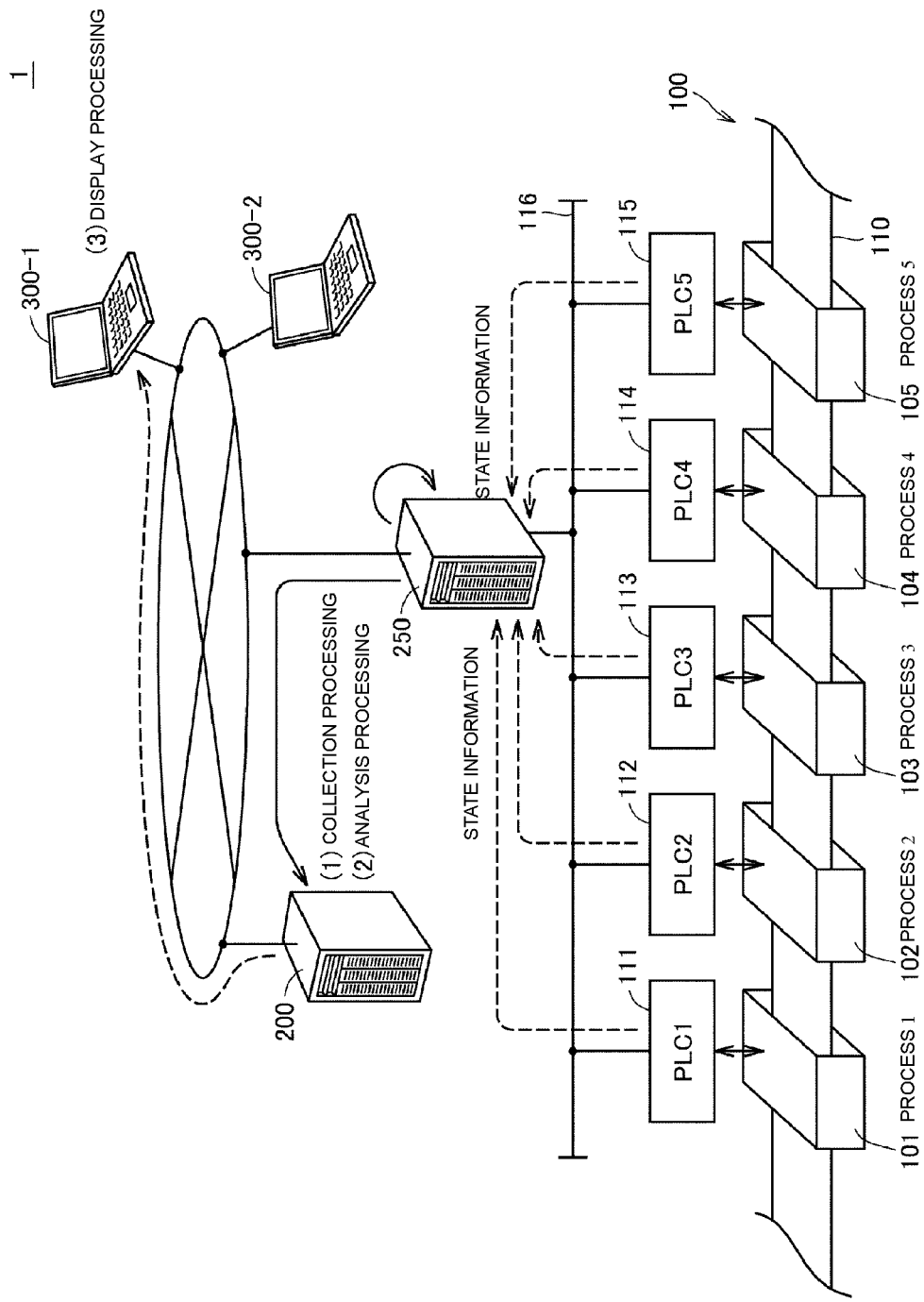
FIG. 1 is a schematic diagram illustrating an example of a configuration of a management system according to the present embodiment.

Embodiments of the present invention will be described in detail with reference to the drawings. In the drawings, the same signs will be attached to the same or corresponding parts and description thereof will not be repeated.

A. EXAMPLE OF CONFIGURATION OF MANAGEMENT SYSTEM

First, an example of a configuration of a management system according to the present embodiment will be described. FIG. 1 is a schematic diagram illustrating an example of a configuration of the management system according to the present embodiment. Referring to FIG. 1, the management system 1 is associated with manufacturing equipment 100 having a plurality of processes and provides a function for performing quality management of the manufacturing equipment. As an example, the manufacturing equipment 100 shown in FIG. 1 has processes 101 to 105 arranged along a conveyor 110 for carrying workpieces. In FIG. 1, the processes 101 to 105 are also denoted by "process 1" to "process 5." Operations in the processes 101 to 105 are respectively controlled and monitored by programmable logic controllers (PLCs) 111 to 115 corresponding to an example of a control device. In FIG. 1, PLCs 111 to 115 are denoted by "PLC1" to "PLC5."

The PLCs 111 to 115 are connected through a local network 116 such that they can communicate and transmit state information about a process which is a control target to a relay server device 250 on the local network 116 for each of predetermined periods or each of events.

The relay server device 250 transfers state information from each of the PLCs 111 to 115 to a collection and analysis server device 200. Here, the relay server device 250 may perform pre-processing for the state information.

The collection and analysis server device 200 collects state information received from the relay server device 250 and analyzes the collected information. The collection and analysis server device 200 outputs an analysis result to a terminal device 300 when a predetermined condition is satisfied or a request is received from terminal devices 300-1 and 300-2 (collectively also referred to as "terminal device 300" hereinafter).

Although FIG. 1 exemplifies a configuration in which PLCs are respectively provided in a plurality of processes of a single item of manufacturing equipment 100 and the PLCs are connected to the relay server device 250 through the same local network 116 as a typical example, the present invention is not limited thereto. For example, a configuration in which a plurality of PLCs are directly connected to the collection and analysis server device 200 without the relay server device 250 may be employed. In this case, the PLCs respectively transmit information necessary for the collection and analysis server device 200.

Alternatively, a plurality of relay server devices 250 may be provided. In this case, a certain relay server device 250 may transfer state information from some PLCs to the collection and analysis server device 200 and another relay server device 250 may transfer state information from the remaining PLCs to the collection and analysis server device 200.

B. EXAMPLE OF HARDWARE CONFIGURATION OF PLC

Figure 2:
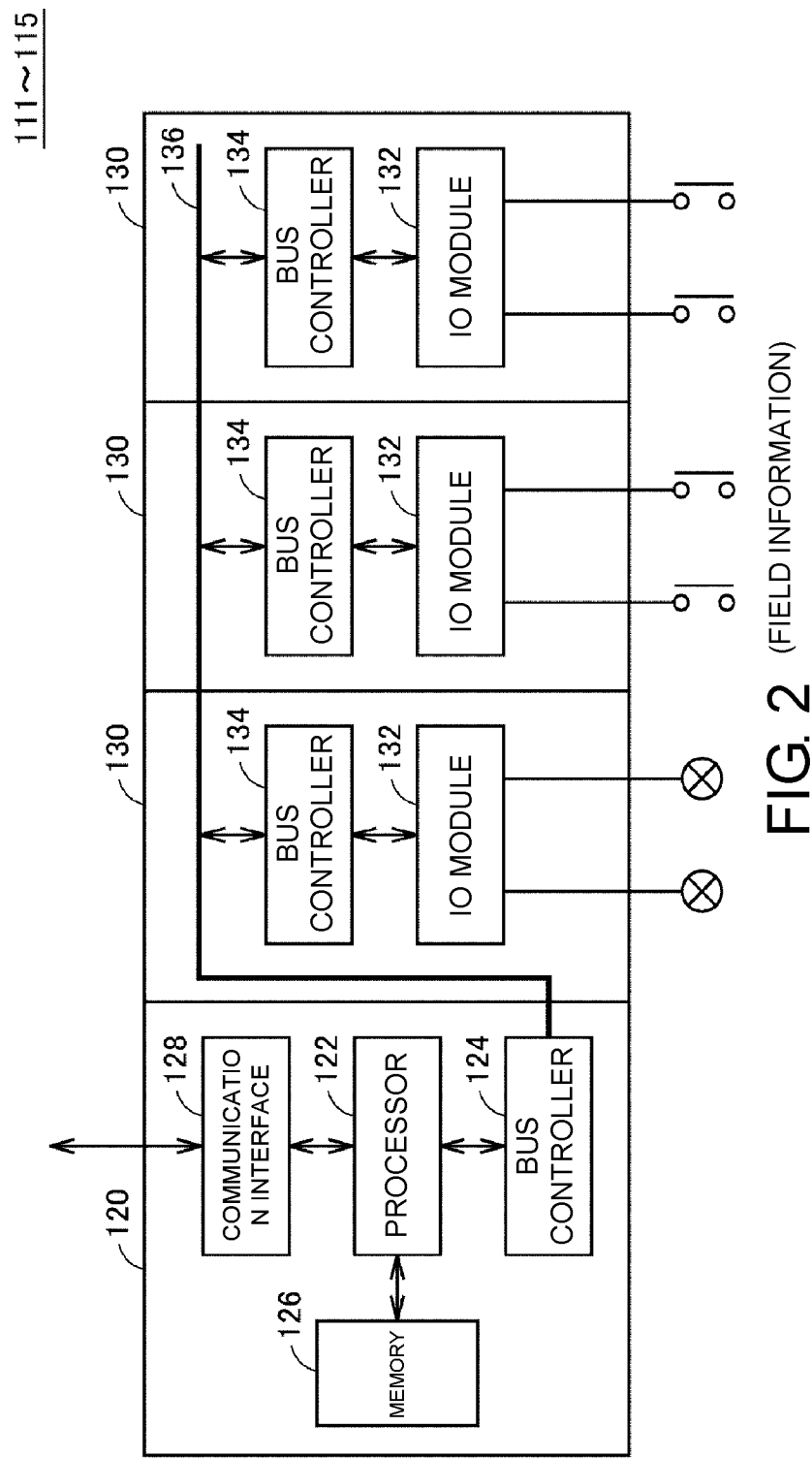
FIG. 2 is a schematic diagram illustrating an example of a hardware configuration of a PLC constituting the management system according to the present embodiment.

Next, an example of a hardware configuration of a PLC will be described. FIG. 2 is a schematic diagram illustrating an example of a hardware configuration of a PLC constituting the management system 1 according to the present embodiment. Referring to FIG. 2, the PLC includes an operation unit 120 and one or more functional units 130. The operation unit 120 is a control device which executes a pre-stored user program and the like, acquires field signals (information representing a state of equipment corresponding to a control target, and the like) from the functional units 130 and outputs a necessary control signal through the functional units 130.

The operation unit 120 includes a processor 122 which executes a user program and the like, a memory 126 which stores the user program, an operating system (OS), various types of data and the like, a bus controller 124 which controls exchange of data through an internal bus 136, and a communication interface 128. The memory 126 may be configured by combining a volatile storage device such as a dynamic random access memory (DRAM) and a non-volatile storage device such as a flash memory.

The communication interface 128 may include one or more communication ports depending on devices corresponding to targets with which data is exchanged. For example, a communication port for connecting to the local network 116 (refer to FIG. 1) according to Ethernet (registered trademark), a communication port with respect to a universal serial bus (USB) for connecting to a personal computer and the like, a communication port supporting a serial line and a parallel line, and the like may be mounted.

The functional units 130 may provide an input/output (IO) function for exchanging various types of information with equipment corresponding to a control target. Specifically, the functional unit 130 may have a digital input (DI) function of receiving digital signal, a digital output (DO) function of outputting digital signals, an analog input (AI) function of receiving analog signals, an analog output (AO) function of outputting analog signals, and the like. Further, special functions such as proportional integral derivative (PID) control and motion control may be included therein.

For example, each functional unit 130 which provides the IO function includes an IO module 132 and a bus controller 134 for controlling exchange of data with the operation unit 120 through the internal bus 136. Each IO module 132 acquires information (field information) from a process of a control target and transmits collected information to the relay server device 250 and the collection and analysis server device 200 through the operation unit 120.

In the management system 1 according to the present embodiment, any PLC which has an interface for outputting internal information to an external device using any communication component may be employed. The hardware configuration of the PLC is not limited to the configuration shown in FIG. 2 and any configuration may be employed. Practically, a plurality of PLCs present in the manufacturing equipment 100 shown in FIG. 1 are assumed to have manufacturers and model types that are not standardized. In the management system 1 according to the present embodiment, the relay server device 250 handles such differences of manufacturers and model types of the PLCs.

C. EXAMPLE OF HARDWARE CONFIGURATION OF COLLECTION AND ANALYSIS SERVER DEVICE 200

Next, an example of a hardware configuration of the collection and analysis server device 200 will be described. The collection and analysis server device 200 is typically configured as a general-purpose computer.

Figures 3, 4:
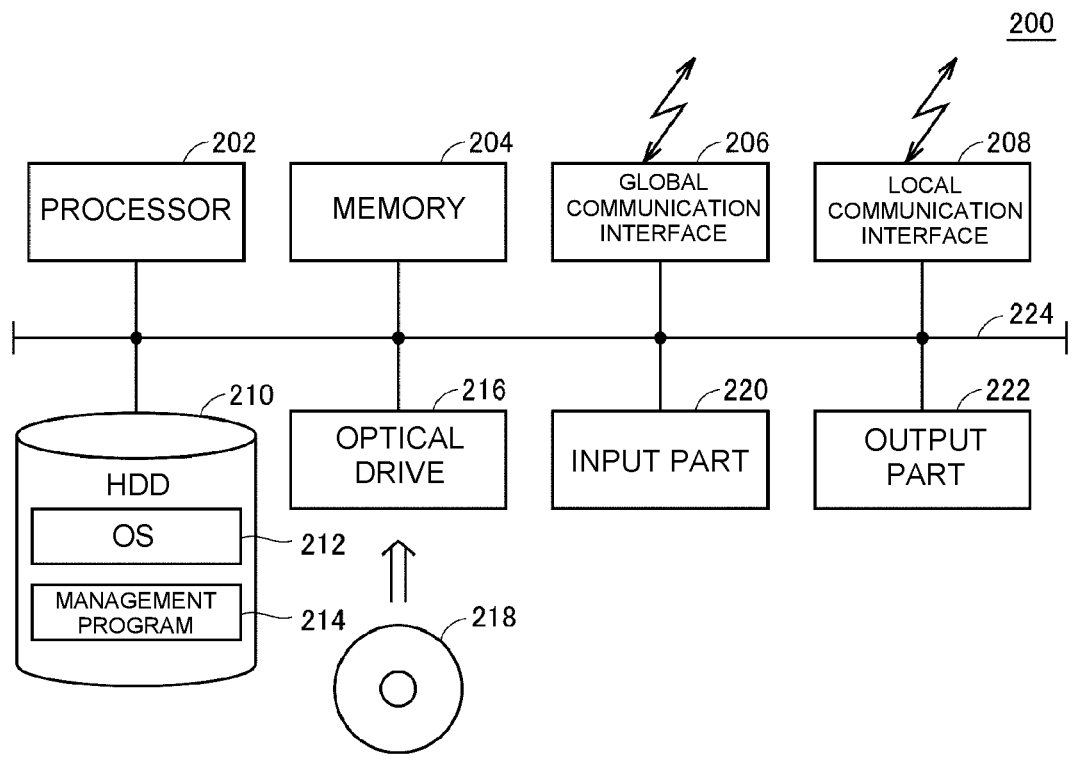
FIG. 3 is a schematic diagram illustrating an example of a hardware configuration of a collection and analysis server device constituting the management system according to the present embodiment.
FIG. 4 is a schematic diagram illustrating an example of mounting of an analysis engine of the collection and analysis server device constituting the management system according to the present embodiment.

FIG. 3 is a schematic diagram illustrating an example of the hardware configuration of the collection and analysis server device 200 constituting the management system 1 according to the present embodiment. Referring to FIG. 3, the collection and analysis server device 200 includes a processor 202 which executes various programs including an operating system (OS) 212 and a management program 214, a memory 204 which provides a work area for storing data necessary to execute programs in the processor 202, and a hard disk drive (HDD) 210 which stores programs and the like executed in the processor 202 in a non-volatile manner.

The collection and analysis server device 200 has an optical drive 216, reads a program stored in an optical recording medium 218 (e.g., a digital versatile disc (DVD)) in which a computer-readable programs is non-transiently stored from the optical recording medium and installs the read program in the hard disk drive 210.

The collection and analysis server device 200 further includes an input unit 220 to which an operation of a user is applied, and an output unit 222 for outputting processing results to the user and the like. The input unit 220 typically includes a keyboard, a mouse, a touch panel and the like, and the output unit 222 typically includes a display, various indicators, a printer and the like.

The collection and analysis server device 200 further includes a global communication interface 206 for exchanging data with a terminal device 300 and the like, and a local communication interface 208 for exchanging data with the relay server device 250 and the like. These interfaces employ hardware corresponding to a target network.

The above-described components are connected through an internal bus 224. In a typical example of mounting, the collection and analysis server device 200 can be realized using hardware according to a general-purpose architecture and thus no further detailed description will be given here.

D. EXAMPLE OF HARDWARE CONFIGURATION OF RELAY SERVER DEVICE 250

As an example of a hardware configuration of the relay server device 250, a general-purpose computer may be configured as in the example of the hardware configuration of the above-described collection and analysis server device 200 (refer to FIG. 3). Since a specific example of a hardware configuration has been described above, detailed description is not repeated herein.

Here, functions of the relay server device 250 may be replaced by a PLC, or the relay server device 250 may be mounted as a dedicated device using an application specific integrated circuit (ASIC) and the like.

E. OVERVIEW OF 4M MANAGEMENT AND RELATED CONFIGURATION AND PROCESSING

Next, 4M management employed by the management system 1 according to the present embodiment will be described. 4M management is a technique of performing factor analysis from four perspectives of Machine, Man, Material and Method. For an event (problem) occurred in quality management, cause analysis, setting of measures and countermeasures, and the like are examined from these four perspectives.

In the perspective of Machine, for example, factors caused inherently by manufacturing equipment, apparatuses and instruments and the like are classified.

In the perspective of Man, for example, factors such as the number of years of experience and skill level of a worker, physical and mental states of the worker, and contents of work of which the worker is in charge are classified.

In the perspective of Material, for examples, factors caused by properties, qualities, textures and the like of raw materials are classified.

In the perspective of Method, for example, factors caused by procedures determined with respect to each process and the like are classified.

Meanwhile, factors related to any event generated in quality management are not limited to a single factor, and a plurality of factors belonging to the same perspective or different perspectives may be associated with each other and cause occurrence of the event. When a plurality of factors have caused occurrence of an event in association with each other, the plurality of factors may be collectively called a "complex factor."

An objective of the management system 1 according to the present embodiment is to facilitate quality management of manufacturing equipment from the perspective of 4M management. A user (e.g., a person in charge of or responsible for quality management) who does not have knowledge of 4M management can also perform quality management of the manufacturing equipment more efficiently and appropriately by employing the management system 1.

In the management system 1 according to the present embodiment, the function of quality management of manufacturing equipment is mainly provided by the collection and analysis server device 200. The collection and analysis server device 200 has a function of acquiring state information of manufacturing equipment which is a management target. In this specification, "state information of manufacturing equipment" is the concept including overall information necessary to perform 4M management and may include "event information" generated in each process in addition to information (field information) from processes corresponding to control targets transmitted from the PLC 111 to PLC 115 (FIG. 1 and FIG. 2).

In this specification, "event information" may include information which explicitly represents a progress situation of each process and information which implicitly represents the progress situation of each process. For example, the information which explicitly represents a progress situation of each process includes information such as statuses of starting processing, finishing processing and performing processing output from a unique device present for each process or a PLC which controls such a device. In addition, the information which implicitly represents the progress situation of each process includes information indicating (an output of a sensor which detects) arrival of a workpiece which is a processing target at each process, (an output of a sensor which detects) discharge of the processed workpiece from each process, movement of the workpiece between processes, and the like, for example.

In addition, the collection and analysis server device 200 may acquire information such as the number of years of experience, skill, duty, the number of recent working days and the like of a worker in charge of each process from a personnel management system, an attendance management system (both are not shown) or the like with respect to factors belonging to the perspective of Man, for example.

Furthermore, the collection and analysis server device 200 may acquire information on raw materials and the like (types, qualities, properties, purchase dates, purchase location and the like) used in each process from a higher level computer system (not shown) and the like with respect to factors belonging to the perspective of Material, for example.

Moreover, the collection and analysis server device 200 may acquire information such as a predetermined working procedure, and when a plurality of working procedures have been determined, information about which working procedure is designated in each process, and the like from a higher level computer system (not shown) and the like with respect to factors belonging to the perspective of Method, for example.

In this manner, in the management system 1 according to the present embodiment, the collection and analysis server device 200 acquires various types of information necessary to determine occurrence of events and analyze causes in 4M management and thus may include any method and component and any interface mounted therein.

The collection and analysis server device 200 determines whether an event has occurred on the basis of state information acquired from the manufacturing equipment which is a management target, and when a specific event has occurred, outputs analysis results indicating a likelihood of each of one or more factors belonging to each of the four perspectives of 4M management having caused occurrence of the specific event. The collection and analysis server device 200 has a prior knowledge based analysis engine in order to determine a likelihood of a factor having caused occurrence of each event. For example, a causal relationship between an event set as a target and a factor having caused occurrence of the event is statistically acquired, and an analysis engine may be constructed on the basis of the statistical causal relationship.

For example, when a certain event X is generated, a function $P(Xm: Yn)$ representing a likelihood P of a factor Yn being a factor having caused occurrence of the event Xm (both n and m are positive integers) can be defined. FIG. 4 is a schematic diagram illustrating an example of mounting of the analysis engine of the collection and analysis server device 200 constituting the management system 1 according to the present embodiment. Referring to FIG. 4, for any event Xm, a likelihood of each factor Yn having caused occurrence of the event Xm can be calculated by providing the function $P(Xm: Yn)$ in a 2-dimensional arrangement.

Further, a complex factor may be defined as a multi-dimensional function. For example, when a certain event X is generated, a function $P(Xm: Yn', Yn'')$ representing a likelihood P of a factor $Yn'$ and a factor $Yn''$ being factors having caused occurrence of the event Xm (both n and m are positive integers) can be defined. Further, a larger number of factors can be associated. Alternatively, a correlation coefficient $a(Yn', Yn'')$ between factors may be acquired in advance, and a product of a function $P(Xm: Yn')$ and a function $P(Xm: Yn'')$ may be multiplied by the correlation coefficient $a(Yn', Yn'')$ to determine a complex factor with respect to the event Xm.

The collection and analysis server device 200 acquires such an analysis engine in advance, calculates a likelihood of a factor having caused occurrence of the event Xm for each factor when generation of the event Xm is detected, and outputs analysis results. Here, each factor Yn is regarded as belonging to any perspective of (Machine), (Man), (Material) and (Method) of 4M management.

The aforementioned analysis engine can be created from data generated in the past in manufacturing equipment which has been a management target, data acquired in manufacturing equipment similar to the manufacturing equipment which is a management target, and the like using an analysis technology for so-called big data.

In addition, stopping or any abnormality of the manufacturing equipment may be considered to be a detected event. For example, when the manufacturing equipment stops or any abnormality is generated in the manufacturing equipment, whether any factor belonging to any one of the four perspectives needs to be handled for the event can be determined more easily.

F. CONTROL STRUCTURE

Figure 5:
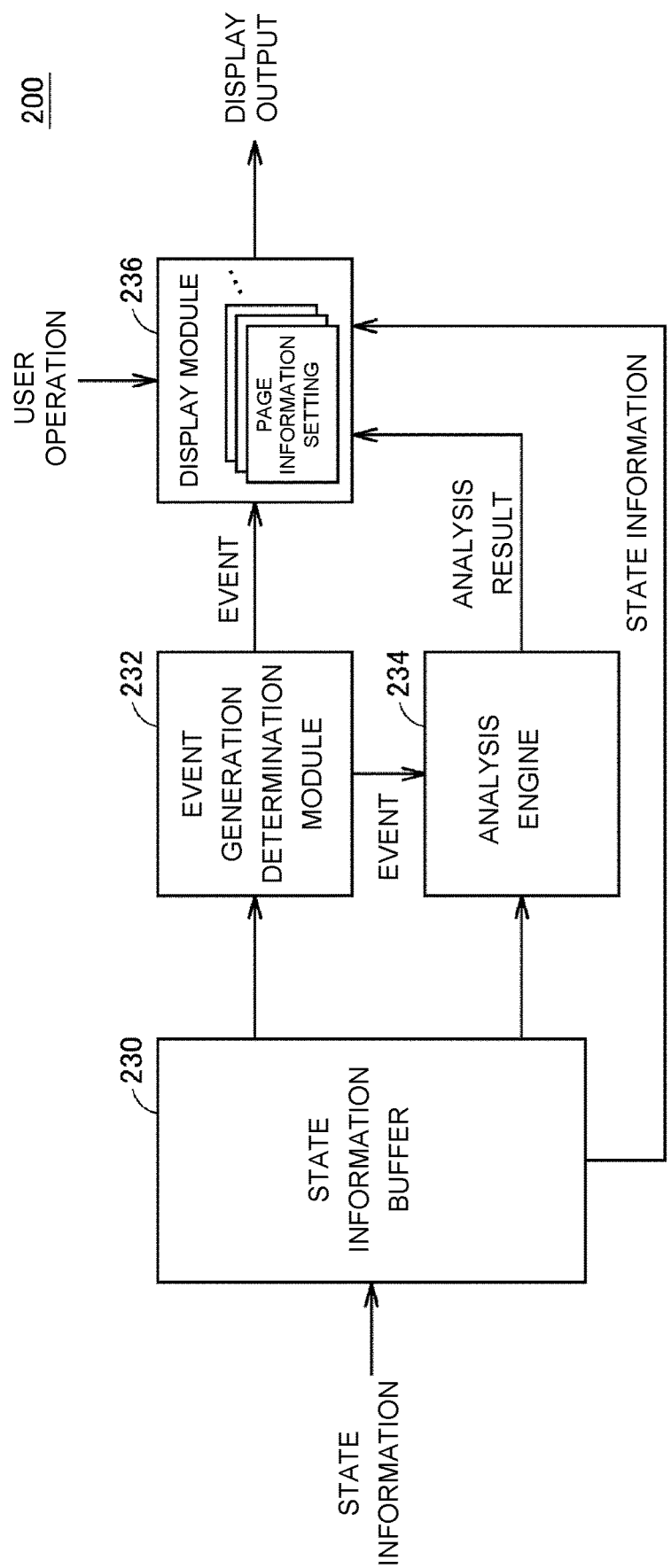
FIG. 5 is a schematic diagram illustrating an example of a control structure in the collection and analysis server device constituting the management system according to the present embodiment.

Next, an example of a control structure for realizing provision of the aforementioned 4M management function will be described. FIG. 5 is a schematic diagram illustrating an example of a control structure in the collection and analysis server device 200 constituting the management system 1 according to the present embodiment.

Referring to FIG. 5, the collection and analysis server device 200 includes a state information buffer 230, an event generation determination module 232, an analysis engine 234, and a display module 236 as the control structure. These components are typically realized by the management program 214 (FIG. 3) being executed by the processor 202 of the collection and analysis server device 200.

The state information buffer 230 acquires state information from the manufacturing equipment which is a management target and temporarily stores the state information. The state information of the manufacturing equipment stored in the state information buffer 230 is output to the event generation determination module 232, the analysis engine 234 and the display module 236 as necessary.

The event generation determination module 232 determines whether an event has been generated on the basis of the acquired state information stored in the state information buffer 230. That is, the event generation determination module 232 detects generation of an event on the basis of the acquired state information. Typically, detection of generation of an event can be performed in such a manner that a criterion (a threshold value or the like) preset for each piece of state information is compared with a current value of the state information, and when the current value reaches the criterion, it is determined that the corresponding event (e.g., equipment failure) has been generated. Alternatively, when a specific flag is generated from a unique device present for each process, it may be determined that a failure or an abnormality has occurred on the basis of the flag.

In addition, when it is determined that an event has been generated, the event generation determination module 232 outputs the determination result (the contents of the event) to the analysis engine 234 and the display module 236.

The analysis engine 234 analyzes factors that have likely caused occurrence of the event depending on the event notified by the event generation determination module 232 and outputs the analysis results to the display module 236. More specifically, when an event is generated, the analysis engine 234 calculates a likelihood of each of a plurality of predetermined factors having caused occurrence of the event.

The display module 236 provides various user interfaces necessary for 4M management on the basis of information of the event from the event generation determination module 232, the analysis results from the analysis engine 234, and the state information stored in the state information buffer 230. The display module 236 may gradually change displayed and output contents according to user operation. More specifically, the display module 236 has a plurality of page information settings and selectively activates these page information settings to perform necessary display output. User interfaces provided by the display module 236 will be described later in detail.

G. USER INTERFACE

Next, examples of user interfaces provided by the collection and analysis server device 200 will be described. The management system 1 can manage a plurality of items of manufacturing equipment and the collection and analysis server device 200 can provide a user interface screen displaying states in a plurality of stages included in 4M management in a drill down or drill up manner.

FIG. 6 to FIG. 11 show examples of screens which display user interfaces provided by the collection and analysis server device 200 constituting the management system 1 according to the present embodiment.

Figure 6:
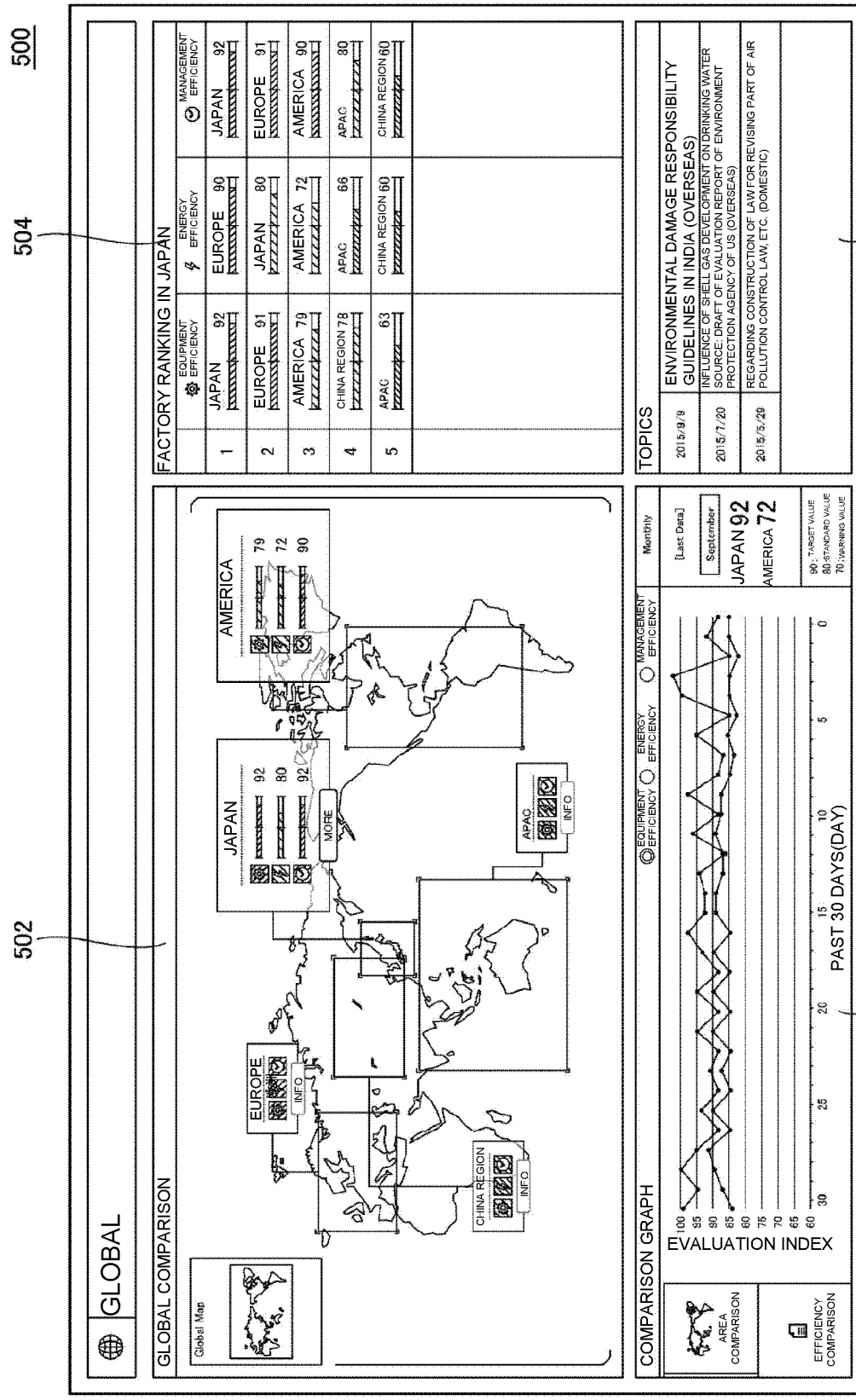
FIG. 6 is an example of a screen displaying a user interface provided by the collection and analysis server device constituting the management system according to the present embodiment.

A user interface screen 500 shown in FIG. 6 shows an overview of manufacturing equipment managed by the management system 1 and displays an overview of the operating situation of the manufacturing equipment present in each area of the world for each area, for example.

More specifically, the user interface screen 500 includes a map display area 502, and an overview of the operating situation of the manufacturing equipment is displayed in the map display area 502 using icons for each of areas of the Japan, America, Europe, APAC and China regions. In the example shown in FIG. 6, the operating situation of the manufacturing equipment is indicated using three indexes of equipment efficiency, energy efficiency and management efficiency, and whether each index corresponds to any one of a plurality of preset stages can be recognized at a glance. As an example, a target value, a standard value, a warning value and the like are set as the plurality of stages.

The user interface screen 500 includes a ranking area 504 of each index. Regional ranking is displayed in the ranking area 504 for each of the three indexes of equipment efficiency, energy efficiency and management efficiency.

The user interface screen 500 includes a comparison area 506 in which index values (trends) between selected areas can be compared with each other. The comparison area 506 is displayed as a graph in a state in which variations of selected indexes over a predetermined period can be compared between two or more areas selected by a user.

The user interface screen 500 includes a topic display area 508 in which news related to production activity and the like are displayed.

It is possible to recognize all overviews at a glance even when global manufacturing equipment is a management target by providing the user interface screen 500.

Figure 7:
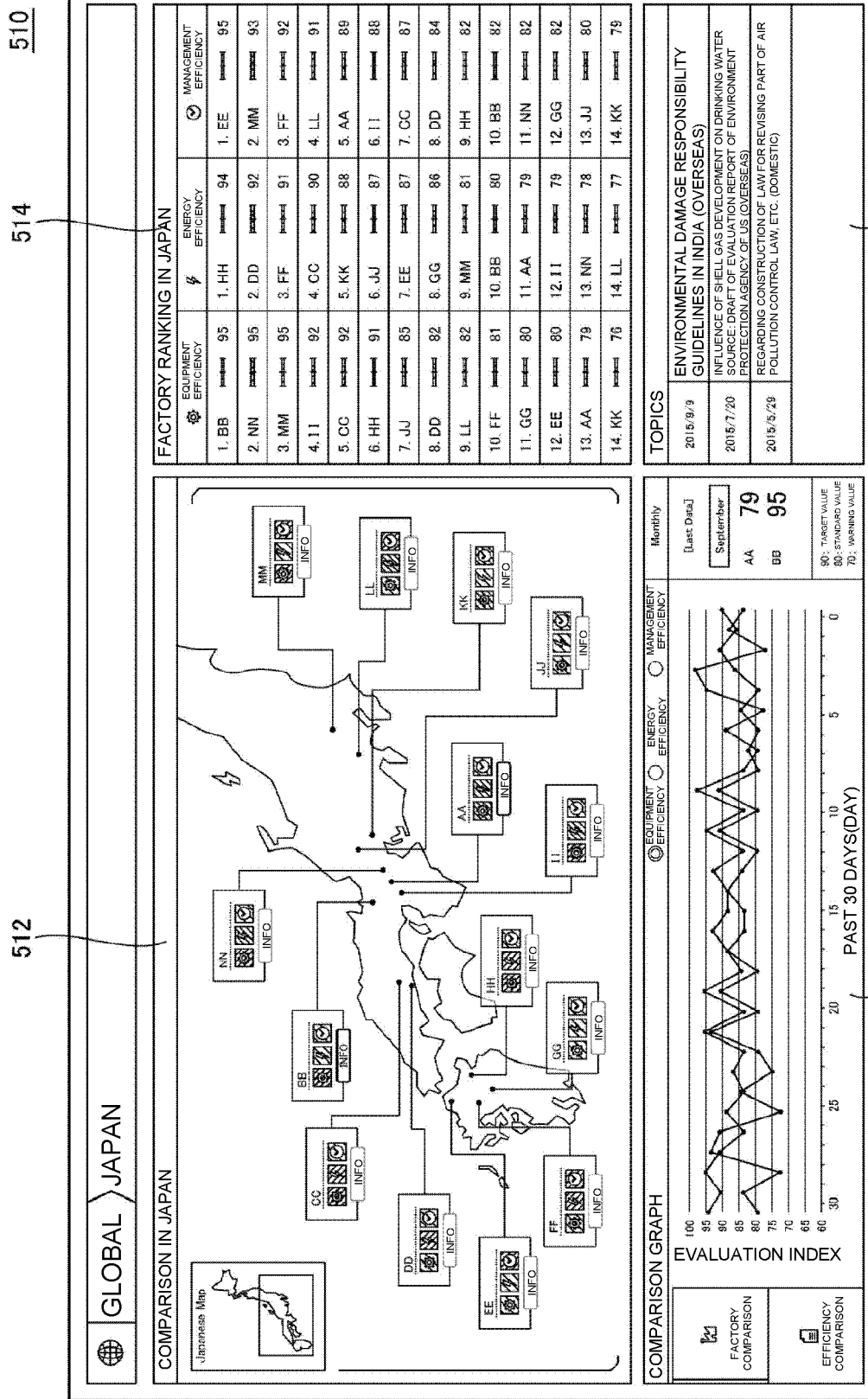
FIG. 7 is an example of a screen displaying a user interface provided by the collection and analysis server device constituting the management system according to the present embodiment.

A user interface screen 510 shown in FIG. 7 is displayed when any area is selected in the map display area 502 of the user interface screen 500 shown in FIG. 6 (drill down). The user interface screen 510 includes a map display area 512, and an overview of the operating situation of manufacturing equipment located in the selected area (Japan in this example) is displayed in the map display area 512 using icons. The icons displayed in the map display area 512 of FIG. 7 also indicate the operating situation of the manufacturing equipment using the three indexes of equipment efficiency, energy efficiency and management efficiency like the icons displayed in the map display area 502 of FIG. 6.

The user interface screen 510 includes a ranking area 514 in which ranking of each index with respect to manufacturing equipment present in a selected area is displayed, like the ranking area 504 shown in FIG. 6.

The user interface screen 510 includes a comparison area 506 and a topic display area 508 as in the user interface screen 500 shown in FIG. 6.

Figure 8:
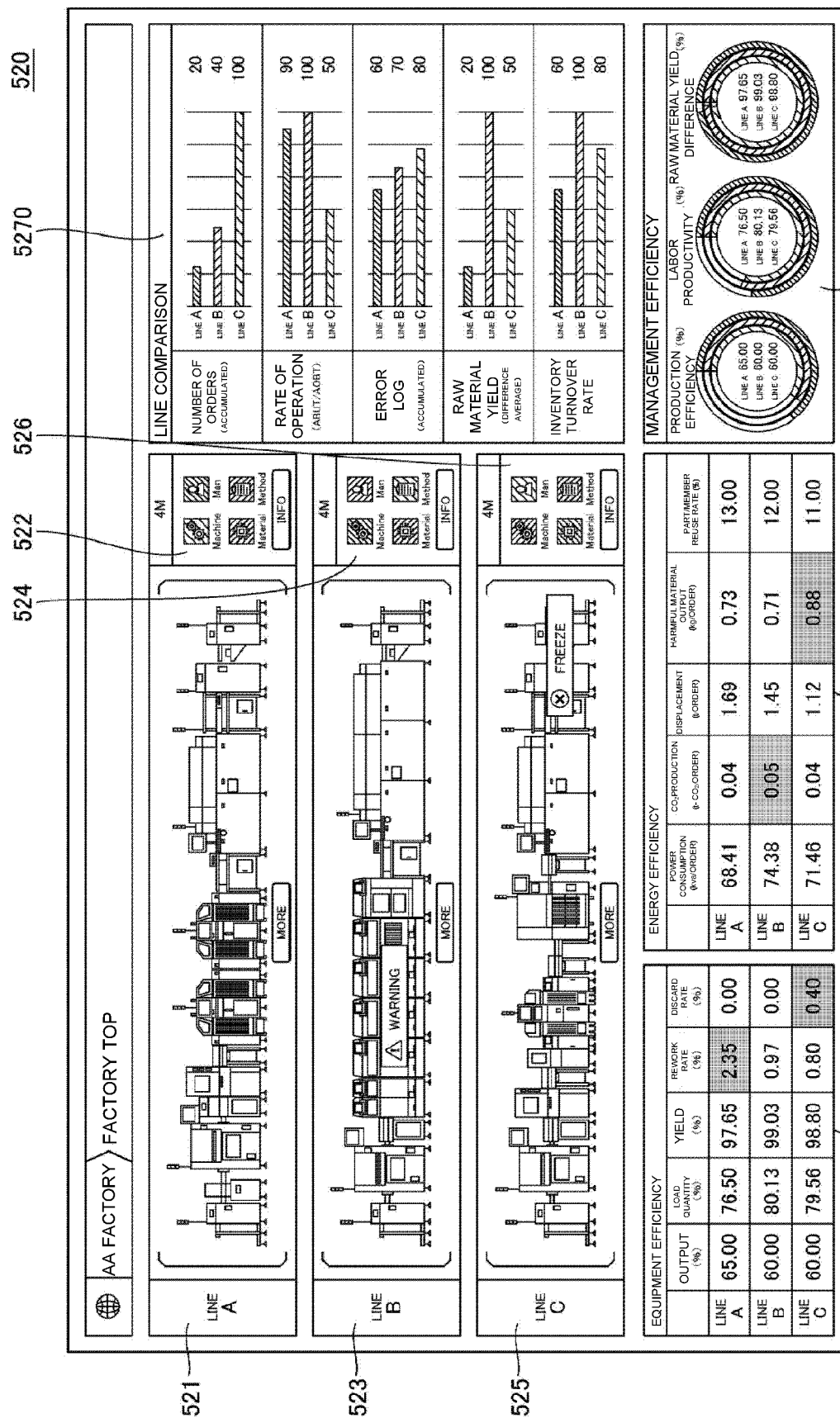
FIG. 8 is an example of a screen displaying a user interface provided by the collection and analysis server device constituting the management system according to the present embodiment.

A user interface screen 520 shown in FIG. 8 is displayed when any manufacturing equipment is selected in the map display area 512 of the user interface screen 510 shown in FIG. 7 (drill down).

The user interface screen 520 displays operating states of one or more manufacturing lines included in the selected manufacturing equipment. More specifically, images 521, 523 and 525 representing respective manufacturing lines and icon groups 522, 524 and 526 indicating respective indexes based on 4M management are displayed in association with each other with respect to the respective manufacturing lines included in the selected manufacturing equipment. Meanwhile, it is desirable that the images 521, 523 and 525 are images through which overviews of target manufacturing lines can be recognized at a glance, and both of specific images such as photos and more abstracted images such as illustrations may be employed.

Each of icon groups 522, 524 and 526 includes a total of four icons respectively indicating Machine, Man, Material and Method, and each icon corresponds to an index indicating a likelihood of a factor of each of the four perspectives having caused occurrence of an event. That is, a display manner of each icon is associated with the level of likelihood of a factor belonging to the corresponding perspective being a factor having caused occurrence of a generated event. Typically, a display color, a display form, a size and the like are differentiated in connection with whether an index value in the corresponding perspective is within any range. That is, each icon is differentiated using a display color, a display form, a blinking speed, the presence or absence of blinking, shading and the like in response to the level of likelihood of a factor belonging to the corresponding perspective having caused occurrence of a generated event. A manager or the like of the manufacturing equipment 100 can be made aware of an overview of states of manufacturing lines at a glance according to the icon groups 522, 524 and 526 indicating indexes based on 4M management, which are displayed corresponding to respective manufacturing lines.

Meanwhile, a numerical value indicating a calculated likelihood, an indicator (a bar graph or a circular graph) indicating a level of a calculated likelihood, and the like may be employed as well as icons.

In this manner, the management system 1 according to the present embodiment displays an index indicating a likelihood of a factor of each of the four perspectives of Machine, Man, Material and Method having caused occurrence of an event using the icon groups 522, 524 and 526 along with the images 521, 523 and 525 which schematically or realistically represent manufacturing lines included in selected manufacturing equipment.

Although FIG. 8 shows an example of a case in which a plurality of manufacturing lines are included in the selected manufacturing equipment and the plurality of manufacturing lines are displayed in parallel, only a single manufacturing line may be displayed. On the other hand, in a case in which manufacturing equipment includes a plurality of manufacturing lines as shown in FIG. 8, combinations of the images 521, 523 and 525 representing the respective manufacturing lines and indexes (the icon groups 522, 524 and 526) of the four perspectives with respect to the plurality of manufacturing lines may be displayed side by side.

The user interface screen 520 includes an area in which various indexes with respect to the manufacturing lines included in the selected manufacturing equipment can be compared. More specifically, bar graphs by which five indexes including the number of orders, rate of operation, error log, raw material yield and inventory turnover rates can be compared between manufacturing lines are displayed in a line comparison area 5270. A table by which five equipment efficiency related indexes including output, load degree, yield, rework rate and discard rate, which are examples of key performance indicators (KPI), can be compared between manufacturing lines is displayed in an equipment efficiency comparison area 5271. A table by which five energy efficiency related indexes including electricity usage, $CO_2$ production, displacement, harmful material output, and reuse rates of parts and members can be compared between manufacturing lines is displayed in an energy efficiency comparison area 5272. A circular graph by which three management efficiency related indexes including production efficiency, labor productivity and raw material yield difference can be compared between manufacturing lines is displayed in a management efficiency comparison area 5273.

It is possible to recognize the abilities and tasks of respective manufacturing lines at a glance by comparing the manufacturing lines from the plurality of perspectives as described above.

Figure 9:
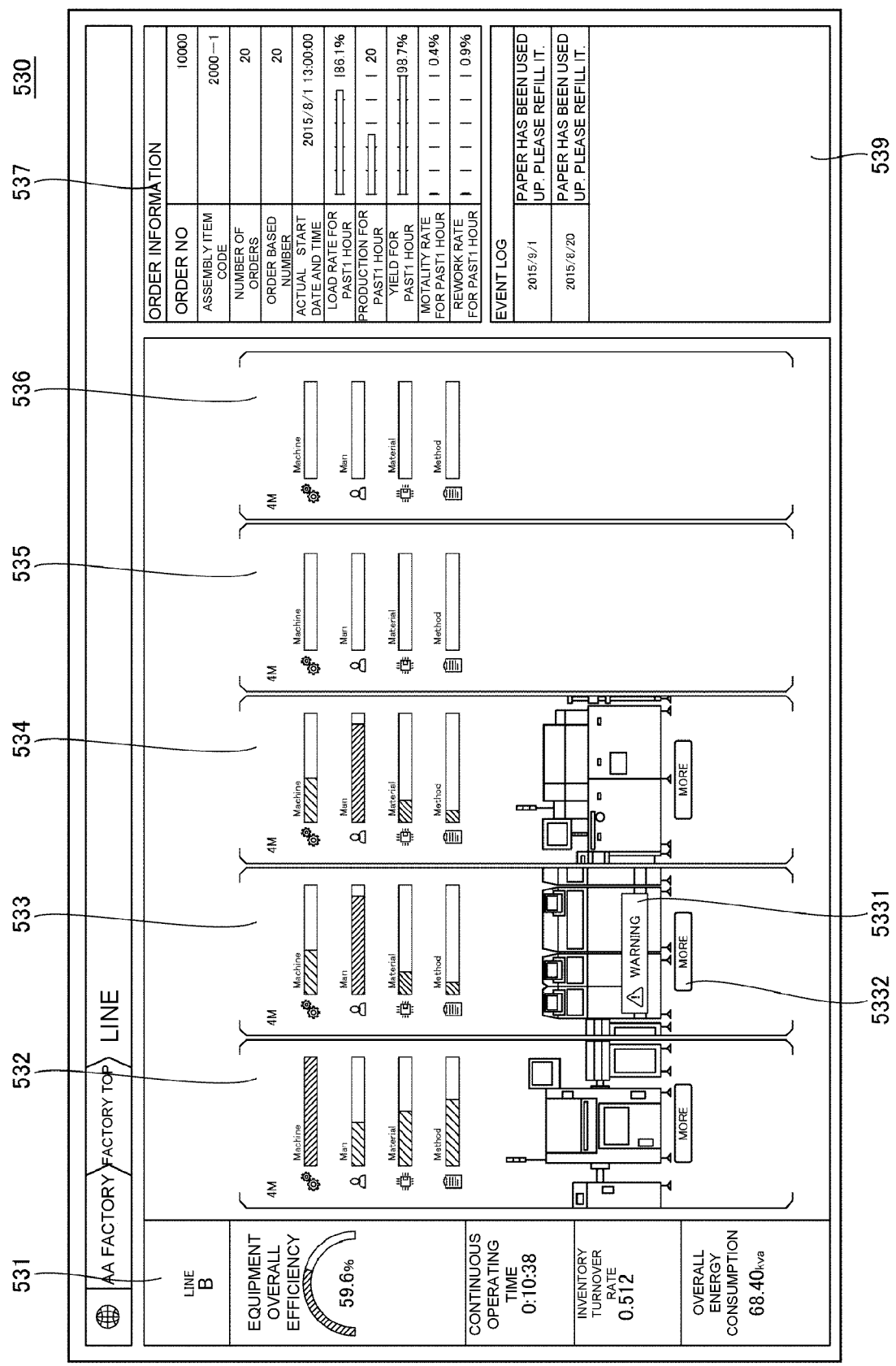
FIG. 9 is an example of a screen displaying a user interface provided by the collection and analysis server device constituting the management system according to the present embodiment.

A user interface screen 530 shown in FIG. 9 is displayed when any one of the images 521, 523 and 525 representing the manufacturing lines of the user interface screen 520 shown in FIG. 8 is selected (drill down). The user interface screen 530 displays a more specific operating state of a selected manufacturing line. More specifically, for one or more processes (devices) included in the selected manufacturing line, images 532, 533, 534, 535 and 536 representing respective processes (devices) and bar graphs indicating respective indexes based on 4M management with respect to the respective processes are displayed in association with each other. Meanwhile, it is desirable that the images 532, 533, 534, 535 and 536 are images through which overviews of target processes can be recognized at a glance, and both of specific images such as photos and more abstract images such as illustrations may be employed. Further, if any defect is generated in any process, an object 5331 indicating a defect is displayed in association with the target process (device).

The user interface screen 530 includes an operating situation display area 531 in which indexes related to manufacture of the selected manufacturing line (equipment overall efficiency, continuous operating time, inventory turnover rate and overall energy consumption) are displayed, and an order information display area 537 in which indexes related to order information of the selected manufacturing line are displayed.

The user interface screen 530 includes an event log area 539 in which events having occurred in any process (device) included in the selected manufacturing line are displayed in the order of occurrence.

Figure 10:
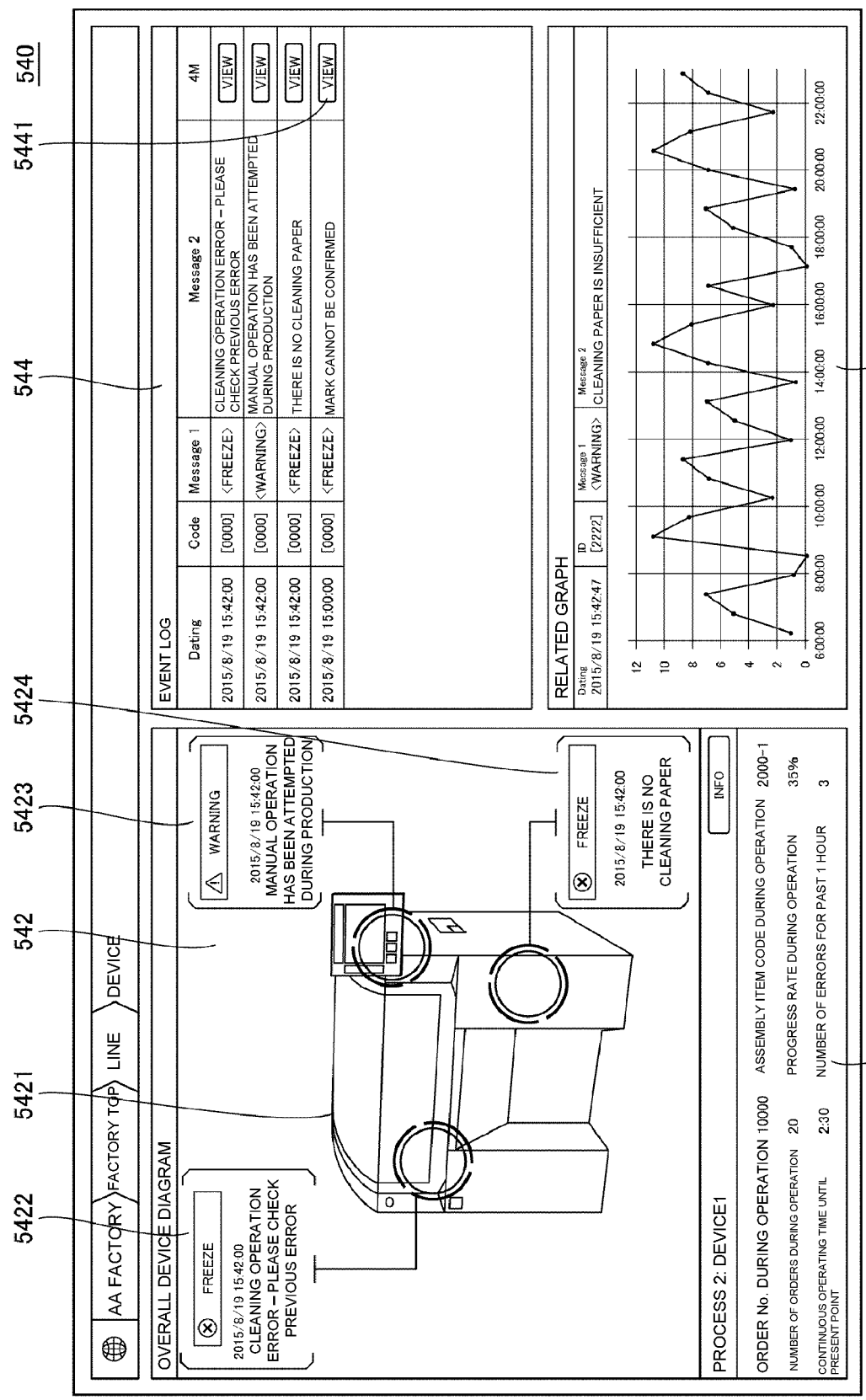
FIG. 10 is an example of a screen displaying a user interface provided by the collection and analysis server device constituting the management system according to the present embodiment.

A user interface screen 540 shown in FIG. 10 is displayed when an object 5332 having a name of "MORE" associated with the images 532, 533, 534, 535 and 536 representing the respective processes (devices) of the user interface screen 530 shown in FIG. 9 is selected (drill down).

The user interface screen 540 displays a more specific operating state of a selected process (device 5421). More specifically, for the device 5421 constituting the selected process, an image 542 representing the device 5421, and when any defects are generated, objects 5422, 5423 and 5424 representing the contents of the defects are displayed in association with portions at which the defects are generated.

The objects 5422, 5423 and 5424 are divided into "FREEZE" indicating that the device 5421 has stopped and "WARNING" indicating that any abnormality has been generated in the device 5421 (which has not reach a stopped state) depending on the contents thereof. Messages and display manners thereof (display color, display form, size and the like) are different depending on such division. The collection and analysis server device 200 causes a corresponding event to occur in response to a preset condition or the like. Such an event, as shown in FIG. 10, may include stopping of manufacturing equipment (FREEZE) and generation of an abnormality in operation of the manufacturing equipment (WARNING).

The user interface screen 540 includes a situation display area 546 in which a current operating situation of the selected process (device 5421) is displayed. Order information of workpieces currently processed by the selected device 5421, and the like are displayed in the situation display area 546.

In addition, the user interface screen 540 includes an event log area 544 in which events occurring in the selected process (device 5421) are displayed in the order of occurrence, and a graph area 548 in which state information related to events included in the event log area 544 is displayed as trends.

As shown in FIG. 8 to FIG. 10, when an event which may become a problem in quality management has occurred, the management system 1 visually displays a portion in which the event has occurred (an object including "WARNING" or "FREEZE" displayed in FIG. 8 to FIG. 10). In addition, it is possible to acquire more specific information about the target event by selecting an object indicating the generated event in each user interface screen. It is possible to perform cause analysis, examination of measures and countermeasures, and the like more efficiently for any event which may occur in manufacturing equipment corresponding to a quality management target by providing drill-down user interfaces in response to a generated event as described above.

Figure 11:
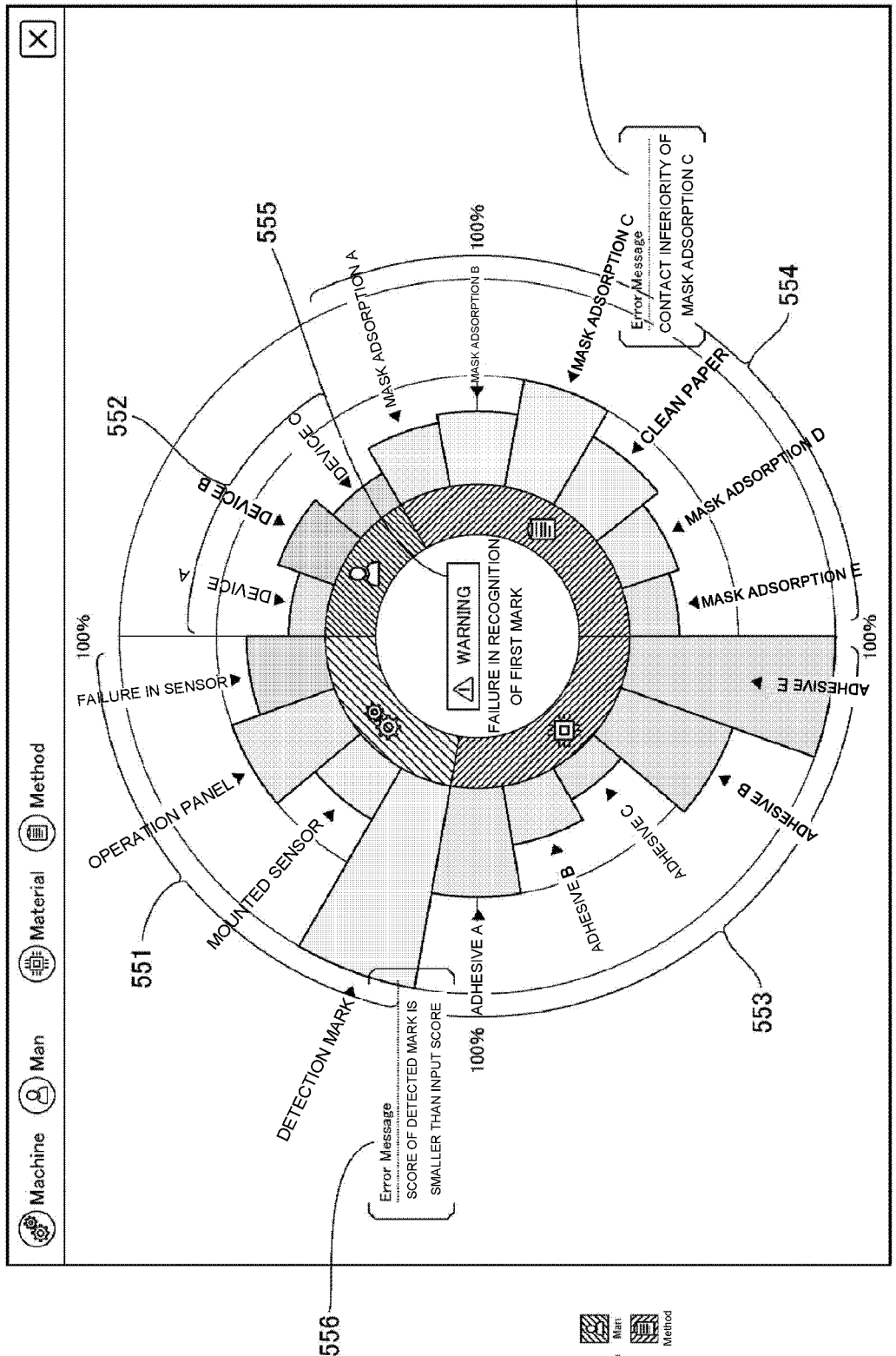
FIG. 11 is an example of a screen displaying a user interface provided by the collection and analysis server device constituting the management system according to the present embodiment.

A user interface screen 550 shown in FIG. 11 is displayed when an object 5441 for displaying details of any event displayed in the event log area 544 of the user interface screen 540 shown in FIG. 10 is selected (drill down).

In the user interface screen 550, a plurality of factors estimated to have caused occurrence of an event displayed at the center are grouped for respective perspectives of 4M management and displayed. That is, for the event "mark recognition failure," (sign 555) which can be causes of generation of the event are listed and displayed in display manners depending on probabilities thereof. More specifically, four factors (sign 551) belonging to Machine, three factors (sign 552) belonging to Man, five factors (sign 553) belonging to Material and six factors (sign 554) belonging to Method are arranged on the circumference of the same circle in the user interface screen 550. Meanwhile, although the user interface screen 550 shows an example in which a plurality of factors belong to each perspective, there may be a case in which only one factor belongs to any perspective.

The management system 1 according to the present embodiment displays a plurality of factors in a display manner in which probabilities thereof are reflected. As an example, a display color, display form, display size and the like may be differentiated for each of the plurality of factors displayed on the user interface screen 550 shown in FIG. 11 depending on the level of probability of each factor being estimated to have caused occurrence of the target event. In other words, the management system 1 differentiates at least one of the area, length and width of objects representing a plurality of factors depending on corresponding probability. Alternatively, the management system 1 differentiates at least one of the color and shape of objects representing a plurality of factors depending on corresponding probability.

In the example shown in FIG. 11, the distance from the center of the circle (length in the radial direction) is proportional to the level of probability, and a factor can be recognized as a factor having a higher probability of having caused occurrence of the target event when the distance from the center of the circle to the circumferential part of the factor is longer. In this manner, a display manner is differentiated depending on a probability to display a plurality of factors having a higher likelihood related to occurrence of a detected event such that the factors can be determined.

In this manner, when a specific event occurs, the management system 1 according to the present embodiment outputs analysis results (the user interface screen 550 shown in FIG. 11) indicating a likelihood of each of one or more factors belonging to each of the four perspectives included in 4M management having caused occurrence of the specific event in response to user selection.

Further, a likelihood of the target event occurring due to a combination of a plurality of factors is also displayed on the user interface screen 550. While one factor belonging to Material is estimated to be a major factor, a factor belonging to Machine and a factor belonging to Method may be displayed as a complex factor in relation to the factor in the example shown in FIG. 11. As a technique of determining this complex factor, a method based on whether related state information has reached a predetermined criterion (e.g., threshold value or the like) may be employed in addition to the aforementioned method using a correlation coefficient. In the example shown in FIG. 11, for two factors belonging to each of Machine and Method, acquired state information exceeds a preset threshold value and thus errors are generated (objects 556 and 557), and such errors are determined to be a complex factor in association with a major factor. In this manner, the management system 1 according to the present embodiment also displays other factors associated with a factor estimated to have caused occurrence of a specific event. That is, the management system 1 can also display other factors associated with a factor estimated to have caused occurrence of a specific event in combination with the factor.

Since analysis results of 4M management are displayed in a manner of implying such a complex factor, the manager or the like of the manufacturing equipment 100 can plan comprehensive measures for improving the quality of a target manufacturing line.

Meanwhile, analysis results of 4M management are not limited to a display manner such as the user interface screen 550 shown in FIG. 11 and may be output in any display manner in which the contents thereof can be recognized.

Figure 12:
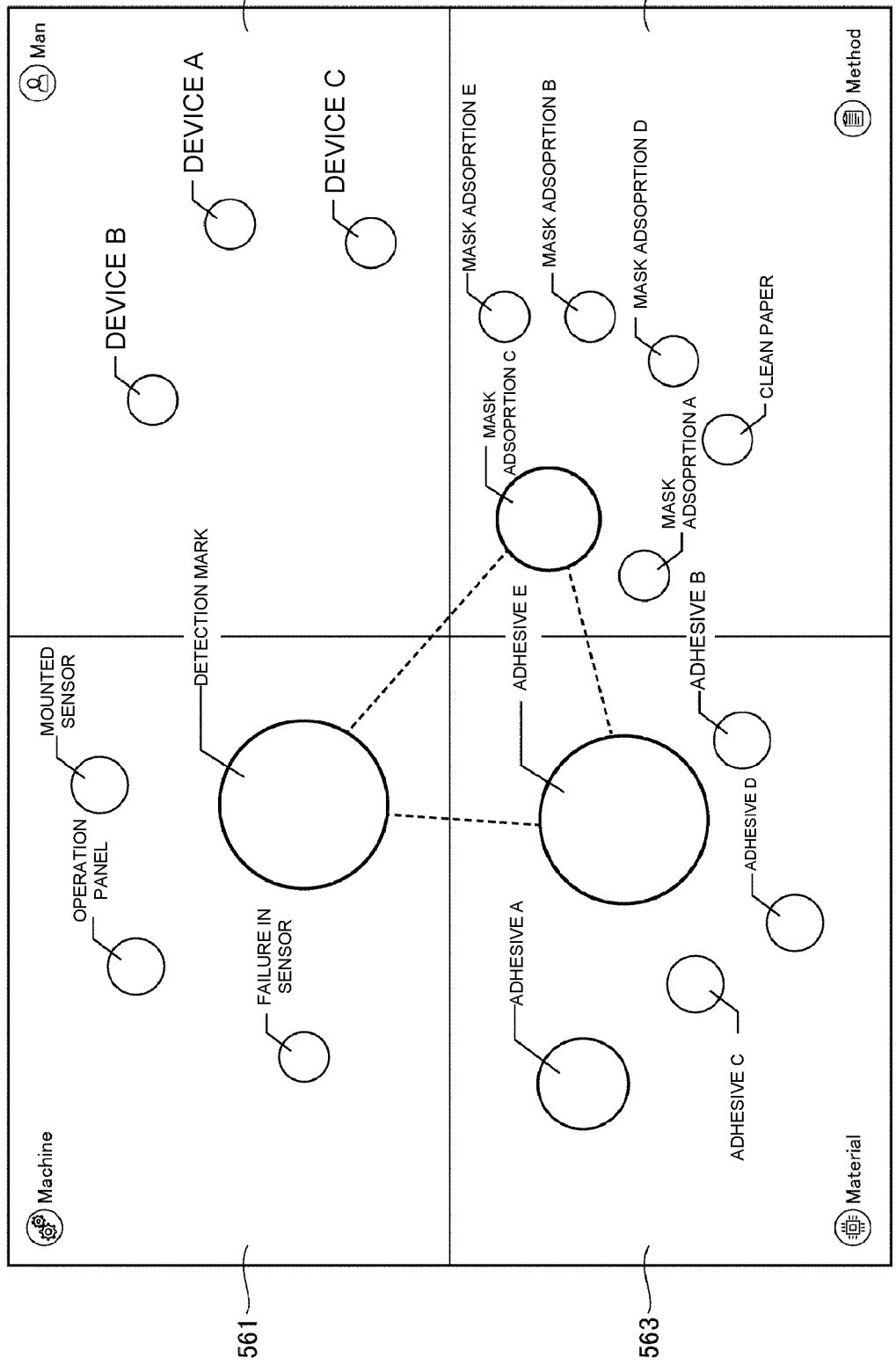
FIG. 12 is a modified example showing a user interface provided by the collection and analysis server device constituting the management system according to the present embodiment.

FIG. 12 is a modified example showing a user interface provided by the collection and analysis server device 200 constituting the management system 1 according to the present embodiment. In a user interface screen 560 shown in FIG. 12, factors which have caused occurrence of a specific event are represented by mapping the four perspectives of 4M management to four quadrants 561-564 on a graph. A perspective to which each factor belongs is represented by a quadrant in which an object indicating each factor is present.

Furthermore, the size of each object is proportional to the level of probability of the corresponding factor having caused occurrence of a target event, and which factor is related to the target event can be recognized at a glance by seeing object sizes.

Moreover, between a plurality of factors determined to be a complex factor, objects indicating a correlation thereof may be displayed in an overlapping manner, as shown in FIG. 12. A complex factor which is a cause of a specific event can be determined more easily by employing the aforementioned display.

As shown in FIG. 11 and FIG. 12, a plurality of factors estimated to have caused occurrence of a certain detected event are classified as factors belonging to any one of four perspectives of Machine, Man, Material and Method (i.e., perspectives of 4M management), and then probabilities of these having caused occurrence of the event and contents thereof are displayed in a comparable manner. As an example of the comparable manner, a plurality of factors may be arranged in parallel on the circumference of the same circle as shown in FIG. 11, or each factor may be plotted on a plane including 4 quadrants 561-564 as shown in FIG. 12.

H. CONCLUSION

As described above, when a specific event has occurred in any manufacturing equipment, the management system 1 according to the present embodiment can determine the region where the specific event has occurred while drilling down the region and can easily determine one or more factors which have caused occurrence of the specific event from the perspective of 4M management. Accordingly, a manager who does not have knowledge of 4M management can also analyze the cause of a problem in quality management and perform a measure or a countermeasure therefor more effectively.

Those skilled in the art can easily understand other aspects of the present invention if they refer to the overall specification of the present application. The disclosed embodiments are to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A management system for performing quality management of manufacturing equipment, comprising:
a processor configured to execute:
an acquisition component which acquires state information of manufacturing equipment that is a management target;
a determination component which determines whether an event has occurred on the basis of the acquired state information;
an analysis component which generates an analysis results indicating a likelihood of occurrence of the event being caused by each of one or more factors belonging to each of the four perspectives;
a display component which displays indexes indicating likelihoods of presence of factors of four perspectives comprising Machine, Man, Material and Method having caused occurrence of the event along with an image that schematically or realistically represents a manufacturing line included in the manufacturing equipment; and
an output component which, when a specific event has occurred, outputs the analysis results indicating a likelihood of occurrence of the specific event being caused by each of one or more factors belonging to each of the four perspectives in response to user selection;
wherein the display component displays, in a form of drill-down or drill-up, a first display screen that displays operating states of one or more manufacturing lines, a second display screen that displays one or more processes comprised in a selected manufacturing line in the first display screen and a third display screen that displays an operating state of a selected process in the second display screen,
the operating state displayed in the third display screen comprises one or more events that occurred in corresponding processes, and
the output component accepts the user selection in the third display screen to select one or more events and outputs the analysis results of the selected one or more events, the third display displays the likelihood of occurrence of the specific event being caused by each of one or more factors belonging to each of the four perspectives in response to the user selection.

2. The management system according to claim 1, wherein the output component collectively displays other factors related to a factor estimated to have caused occurrence of the specific event.

3. The management system according to claim 2, wherein the specific event includes suspension of the manufacturing line, and occurrence of an abnormality in an operation of the manufacturing line.

4. The management system according to claim 3, wherein the display component displays the specific event that has occurred in association with a portion of a target device constituting the manufacturing line.

5. The management system according to claim 4, wherein the display component displays combinations of images that represent respective manufacturing lines and indexes for the respective four perspectives with respect to each of the manufacturing lines side by side.

6. The management system according to claim 3, wherein the display component displays combinations of images that represent respective manufacturing lines and indexes for the respective four perspectives with respect to each of the manufacturing lines side by side.

7. The management system according to claim 2, wherein the display component displays the specific event that has occurred in association with a portion of a target device constituting the manufacturing line.

8. The management system according to claim 7, wherein the display component displays combinations of images that represent respective manufacturing lines and indexes for the respective four perspectives with respect to each of the manufacturing lines side by side.

9. The management system according to claim 2, wherein the display component displays combinations of images that represent respective manufacturing lines and indexes for the respective four perspectives with respect to each of the manufacturing lines side by side.

10. The management system according to claim 1, wherein the specific event includes suspension of the manufacturing line, and occurrence of an abnormality in an operation of the manufacturing line.

11. The management system according to claim 10, wherein the display component displays the specific event that has occurred in association with a portion of a target device constituting the manufacturing line.

12. The management system according to claim 11, wherein the display component displays combinations of images that represent respective manufacturing lines and indexes for the respective four perspectives with respect to each of the manufacturing lines side by side.

13. The management system according to claim 10, wherein the display component displays combinations of images that represent respective manufacturing lines and indexes for the respective four perspectives with respect to each of the manufacturing lines side by side.

14. The management system according to claim 1, wherein the display component displays the specific event that has occurred in association with a portion of a target device constituting the manufacturing line.

15. The management system according to claim 14, wherein the display component displays combinations of images that represent respective manufacturing lines and indexes for the respective four perspectives with respect to each of the manufacturing lines side by side.

16. The management system according to claim 1, wherein the display component displays combinations of images that represent respective manufacturing lines and indexes for the respective four perspectives with respect to each of the manufacturing lines side by side.

17. A non-transitory computer-readable recording medium comprising a management program for performing quality management of manufacturing equipment, the management program causing a computer to function as:
an acquisition component which acquires state information of manufacturing equipment that is a management target;

a determination component which determines whether an event has occurred on the basis of the acquired state information;

an analysis component which generates an analysis results indicating a likelihood of occurrence of the event being caused by each of one or more factors belonging to each of the four perspectives;

a display component which displays indexes indicating likelihoods of presence of factors of four perspectives comprising Machine, Man, Material and Method having caused occurrence of the event along with an image that schematically or realistically represents a manufacturing line included in the manufacturing equipment; and an output component which, when a specific event has occurred, outputs the analysis results indicating a likelihood of occurrence of the specific event being caused by each of one or more factors belonging to each of the four perspectives in response to user selection, wherein the display component displays, in a form of drill-down or drill-up, a first display screen that displays operating states of one or more manufacturing lines, a second display screen that displays one or more processes comprised in a selected manufacturing line in the first display screen and a third display screen that displays an operating state of a selected process in the second display screen, the operating state displayed in the third display screen comprises one or more events that occurred in corresponding processes, and the output component accepts the user selection in the third display screen to select one or more events and outputs the analysis results of the selected one or more events, the third display displays the likelihood of occurrence of the specific event being caused by each of one or more factors belonging to each of the four perspectives in response to the user selection.

* * * * *